(12) United States Patent
Nagao et al.

(10) Patent No.: US 12,339,546 B2
(45) Date of Patent: Jun. 24, 2025

(54) LIGHT ADJUSTMENT DEVICE AND LIGHT ADJUSTMENT PANEL

(71) Applicant: Japan Display Inc., Tokyo (JP)

(72) Inventors: Koichi Nagao, Tokyo (JP); Takeo Koito, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/637,639

(22) Filed: Apr. 17, 2024

(65) Prior Publication Data

US 2024/0264495 A1 Aug. 8, 2024

Related U.S. Application Data

(63) Continuation of application No. PCT/JP2022/033471, filed on Sep. 6, 2022.

(30) Foreign Application Priority Data

Oct. 18, 2021 (JP) .................................. 2021-170393

(51) Int. Cl.
  *G02F 1/1345* (2006.01)
  *G02F 1/1347* (2006.01)
  *H05K 1/18* (2006.01)

(52) U.S. Cl.
  CPC ........ *G02F 1/13458* (2013.01); *G02F 1/1345* (2013.01); *G02F 1/1347* (2013.01); *H05K 1/189* (2013.01); *H05K 2201/10136* (2013.01)

(58) Field of Classification Search
  None
  See application file for complete search history.

(56) References Cited

U.S. PATENT DOCUMENTS 8,599,353 B2  12/2013  Corrigan et al.
11,656,516 B2 *  5/2023  Nagao ................... G02F 1/1347
                                                          349/56

(Continued)

FOREIGN PATENT DOCUMENTS

JP   2002-169173 A   6/2002
JP   2002-169490 A   6/2002

(Continued)

OTHER PUBLICATIONS

Search Report issued in International Patent Application No. PCT/JP2022/033471, mailed Nov. 22, 2022 and English translation of same. 5 pages.

(Continued)

*Primary Examiner* — Dung T Nguyen
(74) *Attorney, Agent, or Firm* — K&L Gates LLP

(57) ABSTRACT

A light adjustment device includes a panel unit in which a plurality of light adjustment panels are stacked in a first direction, each light adjustment panel including a first substrate and a second substrate, the first substrate including two or more terminal groups; and flexible printed circuits each coupled to one of the terminal groups of one of the light adjustment panels. When the panel unit is viewed in the first direction, a plurality of the terminal groups coupled to the flexible printed circuits are provided at each of an end part of the light adjustment panel in a second direction intersecting the first direction and an end part of the light adjustment panel in a third direction opposite the second direction, and the plurality of flexible printed circuits are not superimposed on each other.

3 Claims, 10 Drawing Sheets

(56) References Cited

U.S. PATENT DOCUMENTS

2008/0068315 A1* 3/2008 Kurosaki .............. G02F 1/1345
                                                                345/87
2018/0024395 A1   1/2018 Mitani et al.
2024/0319528 A1*  9/2024 Nagao ................... G02F 1/1347

FOREIGN PATENT DOCUMENTS

| JP | 2004-333567 A   | 11/2004 |
| JP | 2020-024341 A   | 2/2020  |
| KR | 2007-0048974 A  | 5/2007  |
| WO | WO2016/143656 A1 | 9/2016 |

OTHER PUBLICATIONS

Written Opinion issued in International Patent Application No. PCT/JP2022/033471, mailed Nov. 22, 2022. 5 pages.
Office Action issued in related Korean Patent Application No. 10-2024-7012732, mailed on Nov. 26, 2024 and English translation of same. 17 pages.
Office Action issued in related Japanese Patent Application No. 2023-555007, mailed on Dec. 3, 2024 and English translation of same. 8 pages.
Office Action issued in related Canadian Patent Application No. 3,235,211, mailed on Mar. 24, 2025. 3 pages.

* cited by examiner

FIG.7
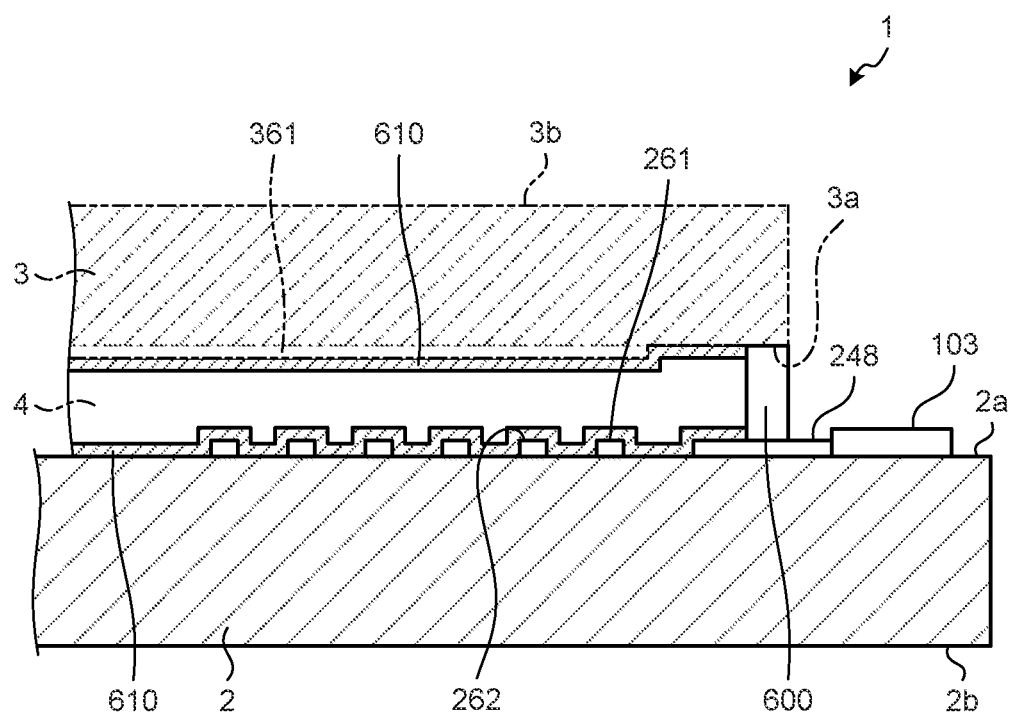
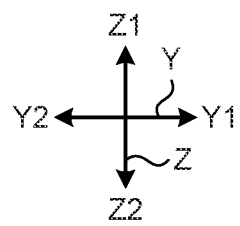

FIG.10
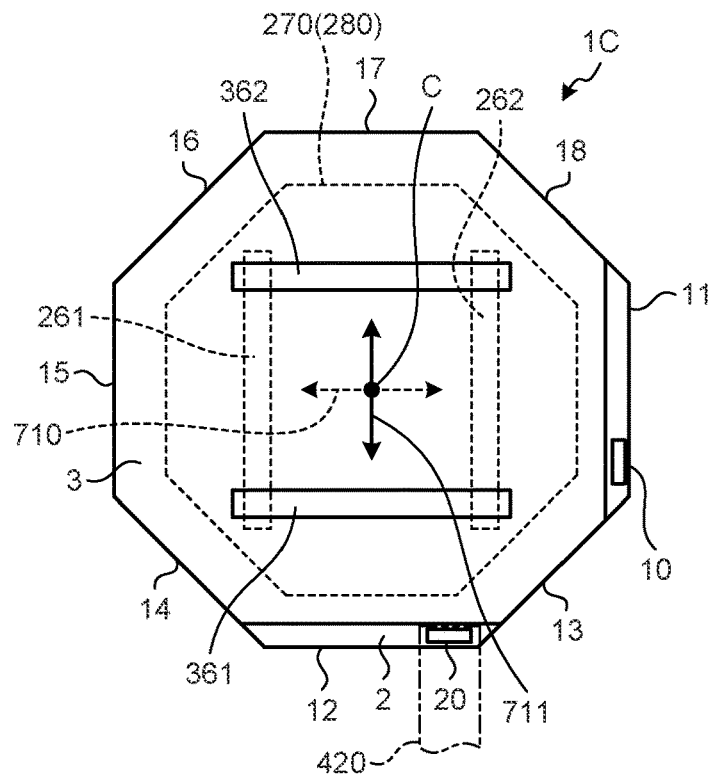
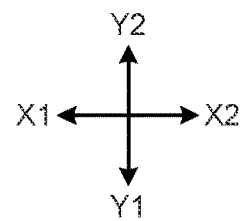
FIG.11
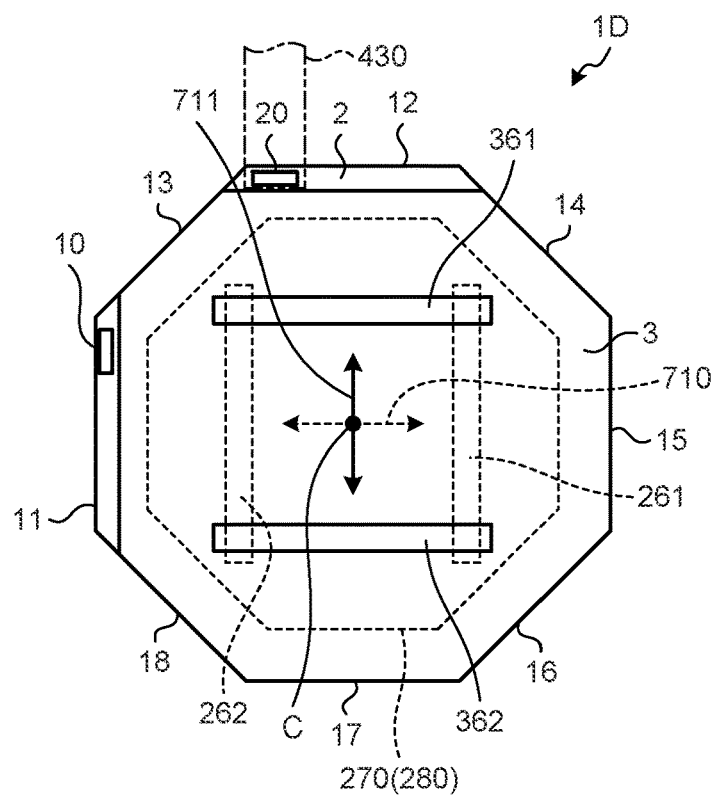
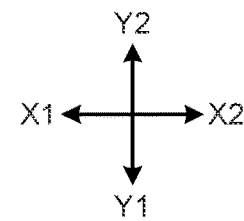

LIGHT ADJUSTMENT DEVICE AND LIGHT ADJUSTMENT PANEL

CROSS-REFERENCE TO RELATED APPLICATION(S)

This application is a continuation of PCT international application Ser. No. PCT/JP2022/033471 filed on Sep. 6, 2022 which designates the United States, incorporated herein by reference, and which claims the benefit of priority from Japanese Patent Application No. 2021-170393, filed on Oct. 18, 2021, incorporated herein by reference.

BACKGROUND

1. Technical Field

The present disclosure relates to a light adjustment device and a light adjustment panel.

2. Description of the Related Art

A light adjustment device of Japanese Patent Application Laid-open Publication No. 2004-333567 includes a light adjustment panel. The light adjustment panel includes a plurality of substrates and a liquid crystal layer encapsulated between the substrates. When incident light enters the light adjustment panel, the light transmittance of the incident light is adjusted in the light adjustment panel and this adjusted transmitted light is output from the light adjustment device.

For a configuration in which a plurality of light adjustment panels are stacked and a printed circuit is coupled to each light adjustment panel via one flexible printed circuit, it has been desired to reduce the number of the printed circuits. In such a case, some flexible printed circuits are coupled to the same printed circuit, but the coupling to the printed circuit is difficult when these flexible printed circuits overlap each other in the same shape when the light adjustment panels are stacked.

SUMMARY

A light adjustment device according to an embodiment of the present disclosure includes a panel unit in which a plurality of light adjustment panels are stacked in a first direction, each light adjustment panel including a first substrate and a second substrate, the first substrate including two or more terminal groups each including a plurality of terminals couplable to one flexible printed circuit, the second substrate overlapping the first substrate, and flexible printed circuits each coupled to one of the terminal groups of one of the light adjustment panels. When the panel unit is viewed in the first direction, a plurality of the terminal groups coupled to the flexible printed circuits are provided at each of an end part of the light adjustment panel in a second direction intersecting the first direction and an end part of the light adjustment panel in a third direction opposite the second direction, and the plurality of flexible printed circuits are not superimposed on each other.

A light adjustment panel according to an embodiment is disclosed, and includes a first substrate and a second substrate, the first substrate including a first terminal group and a second terminal group each including a plurality of terminals couplable to one flexible printed circuit, the second substrate overlapping the first substrate. The first substrate has a first side and a second side intersecting the first side, and the first terminal group is provided along the first side and the second terminal group is provided along the second side.

BRIEF DESCRIPTION OF THE DRAWINGS

FIG. 7 is a sectional view taken along line VII-VII in FIG. 3.

FIG. 10 is a schematic diagram of a third light adjustment panel included in the light adjustment device in FIG. 1A when viewed from the upper side.

FIG. 11 is a schematic diagram of a fourth light adjustment panel included in the light adjustment device in FIG. 1A when viewed from the upper side.

DETAILED DESCRIPTION OF THE PREFERRED EMBODIMENTS

Aspects (embodiments) of the present disclosure will be described below in detail with reference to the accompanying drawings. Contents described below in the embodiments do not limit the present disclosure. Components described below include those that could be easily thought of by the skilled person in the art and those identical in effect. Components described below may be combined as appropriate.

What is disclosed herein is merely exemplary, and any modification that could be easily thought of by the skilled person in the art as appropriate without departing from the gist of the disclosure is contained in the scope of the present disclosure. For clearer description, the drawings are schematically illustrated for the width, thickness, shape, and the like of each component as compared to an actual aspect in some cases, but the drawings are merely exemplary and do not limit interpretation of the present disclosure. In the present specification and drawings, any element same as that already described with reference to an already described drawing is denoted by the same reference sign, and detailed description thereof is omitted as appropriate in some cases.

Figure 1A:
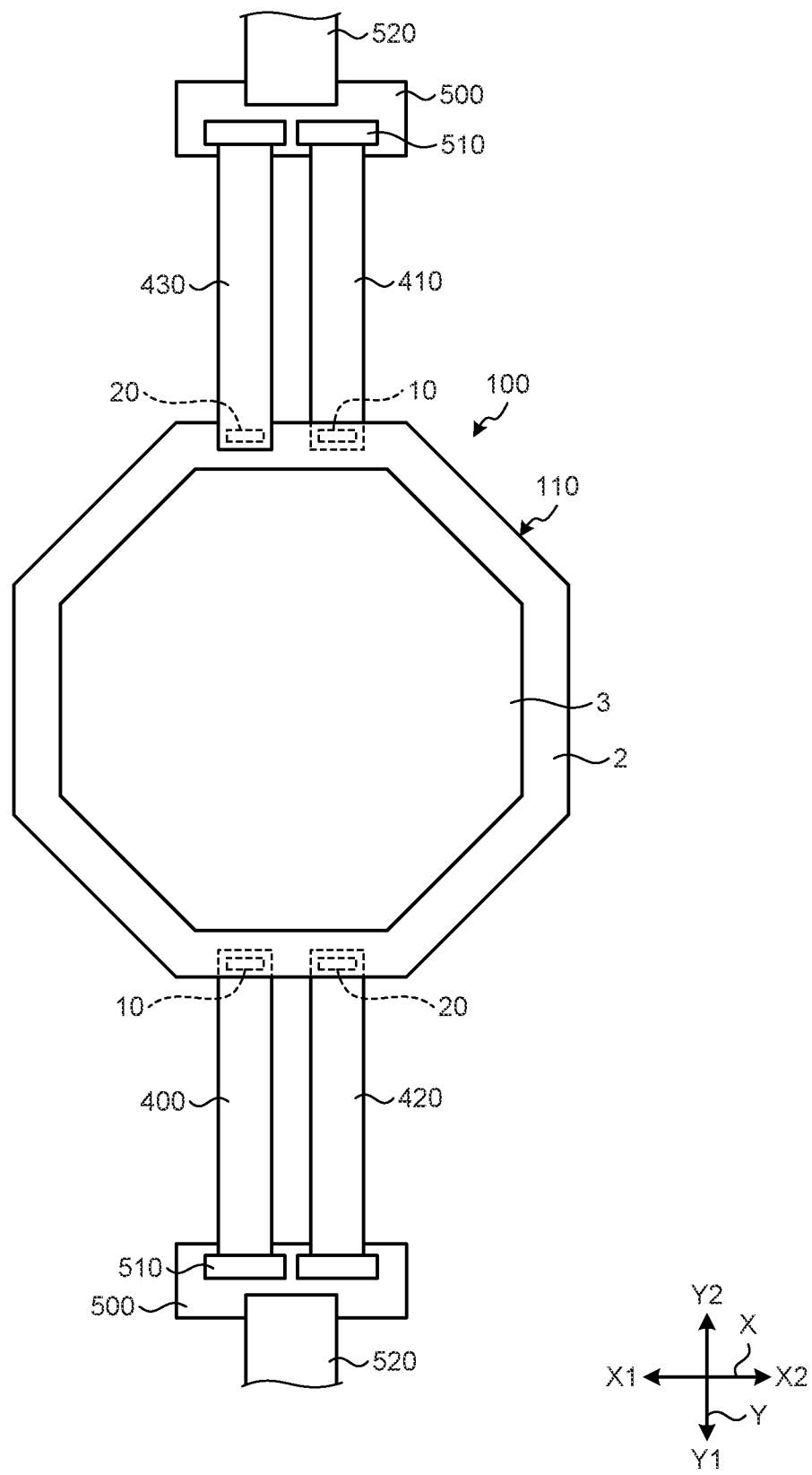
FIG. 1A is a schematic diagram of a light adjustment device according to an embodiment when viewed from the upper side.
Figure 1B:
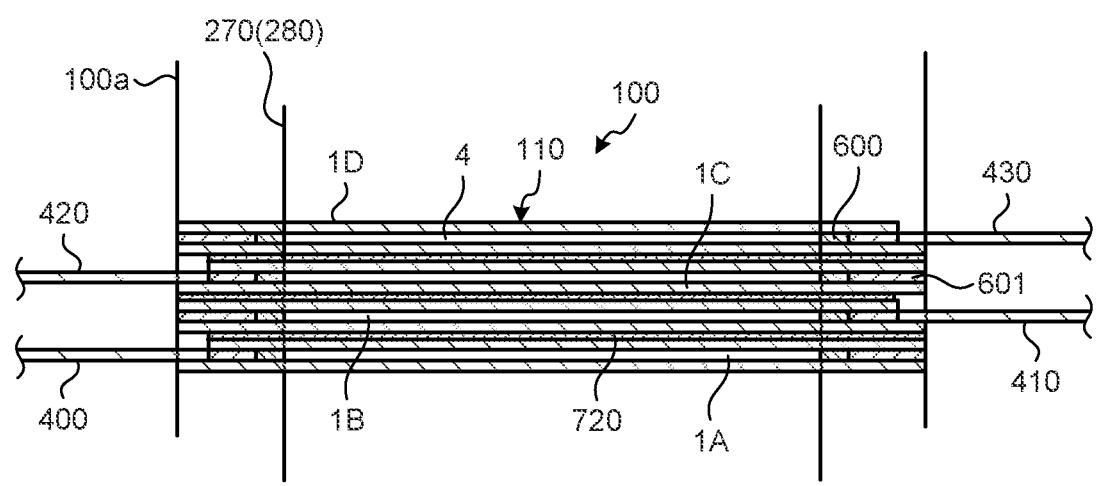
FIG. 1B is a schematic diagram illustrating a section of FIG. 1A.
Figure 2:
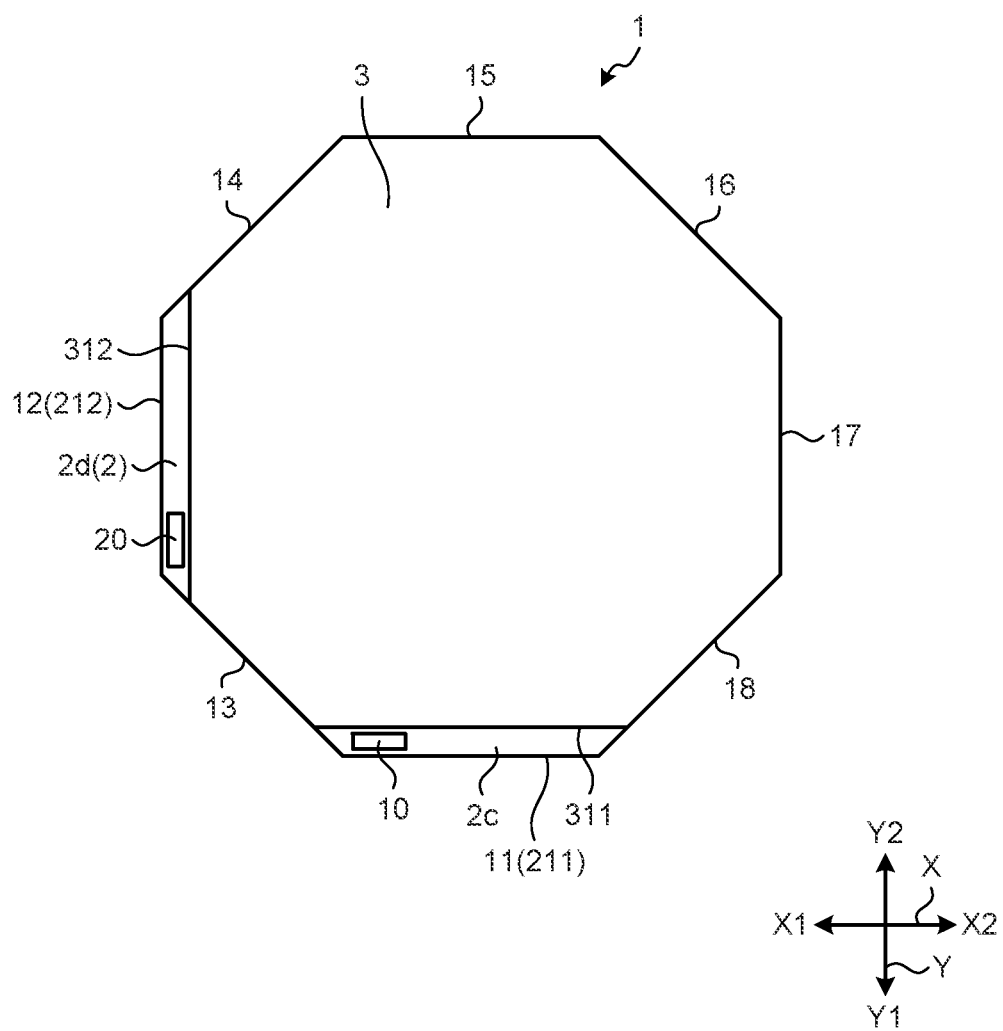
FIG. 2 is a schematic diagram of a light adjustment panel according to the embodiment when viewed from the upper side.
Figure 3:
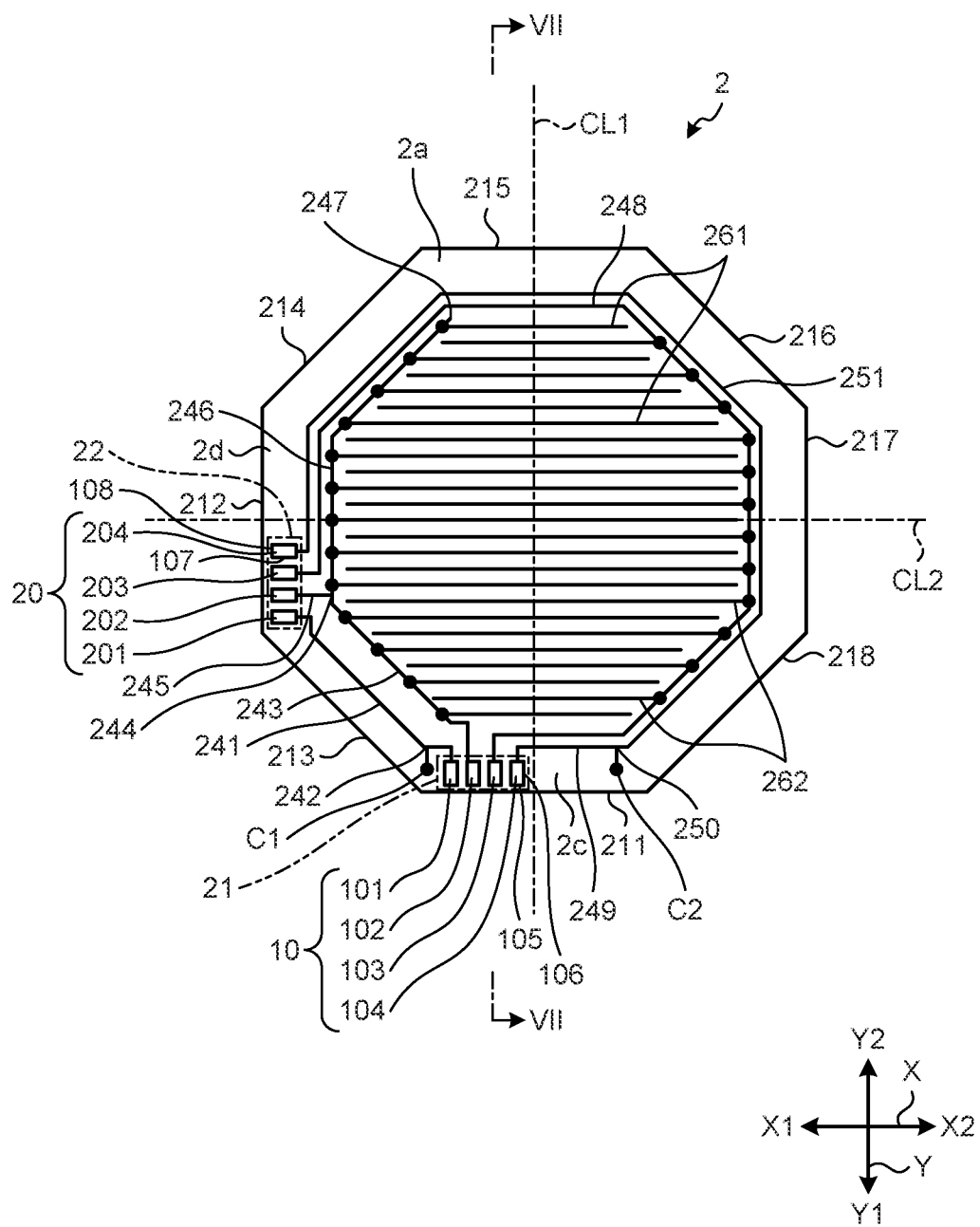
FIG. 3 is a schematic diagram of the front surface of an array substrate according to the embodiment when viewed from the upper side.
Figure 4:
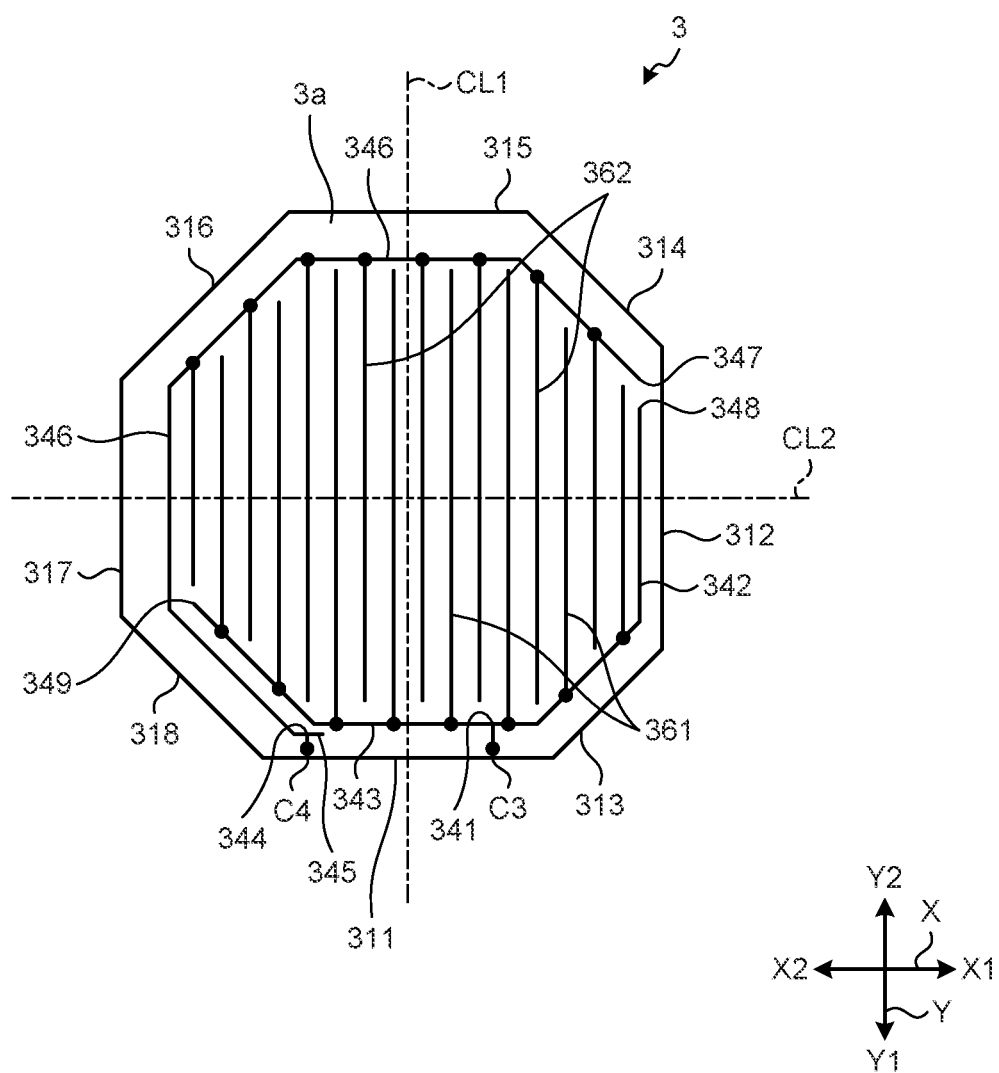
FIG. 4 is a schematic diagram of a counter substrate according to the embodiment when turned over, illustrating its front surface on which wires are provided.

FIG. 1A is a schematic diagram of a light adjustment device according to the embodiment when viewed from the upper side. FIG. 1B is a schematic diagram illustrating a section of FIG. 1A. FIG. 2 is a schematic diagram of a light adjustment panel according to the embodiment when viewed from the upper side. FIG. 3 is a schematic diagram of the front surface of an array substrate according to the embodiment when viewed from the upper side. FIG. 4 is a schematic diagram of a counter substrate according to the embodiment when turned over, illustrating its front surface on which wires are provided.

In an XYZ coordinate system illustrated in the drawings, an X direction is the right-left direction, and an X1 direction is opposite an X2 direction. The X1 direction is also referred to as a left direction, and the X2 direction is also referred to as a right direction. A Y direction is the front-back direction, and a Y1 direction is opposite a Y2 direction. The Y1 direction is also referred to as a front direction, and the Y2 direction is also referred to as a back direction. A Z direction is the up-down direction (stacking direction). A Z1 direction is opposite a Z2 direction. The Z1 direction is also referred to as an upper direction, and the Z2 direction is also referred to as a lower direction. The Z direction is also referred to as a first direction, the Y1 direction is also referred to as a second direction, the Y2 direction is also referred to as a third direction, and the X direction is also referred to as a fourth direction. The first direction and the second direction are orthogonal to (intersect) each other. The first direction and the third direction are orthogonal to (intersect) each other. The second direction is opposite the third direction. The fourth direction is orthogonal to (intersect) the first direction and the second direction. The fourth direction is orthogonal to (intersect) the first direction and the third direction.

As illustrated in FIG. 1A, a light adjustment device 100 according to the embodiment includes a panel unit 110 and flexible printed circuits (FPC) 400, 410, 420, and 430.

As illustrated in FIG. 1A, the shape of the panel unit 110 is a regular octagon in a plan view in the embodiment but is not limited to a regular polygon. Specifically, the shape of the panel unit 110 according to the present invention may be a polygon the number of sides of which is four or more. The panel unit 110 is formed by stacking a plurality of light adjustment panels 1 in the Z direction (first direction). In the present embodiment, a plurality (in the embodiment, four) of light adjustment panels 1 illustrated in FIG. 2 are stacked.

Specifically, as illustrated in FIG. 1B, the four light adjustment panels 1 are a first light adjustment panel 1A, a second light adjustment panel 1B, a third light adjustment panel 1C, and a fourth light adjustment panel 1D. The four light adjustment panels 1 are stacked in the order of the first light adjustment panel 1A, the second light adjustment panel 1B, the third light adjustment panel 1C, and the fourth light adjustment panel 1D from the lower side. In addition, effective regions 270 and 280 are illustrated in FIG. 1B, and end part positions 100a positioned at the peripheries of the effective regions 270 and 280 and outside the effective regions 270 and 280 align when viewed in the stacking direction of the four light adjustment panels 1. Specifically, when viewed in a direction orthogonal to the stacking direction, the end part position 100a of the fourth light adjustment panel 1D on the left side in FIG. 1B aligns with the end part position 100a of the second light adjustment panel 1B on the left side in FIG. 1B, and the end part position 100a of the third light adjustment panel 1C on the right side in FIG. 1B aligns with the end part position 100a of the first light adjustment panel 1A on the right side in FIG. 1B. In each light adjustment panel 1, a seal 600 is provided outside a liquid crystal layer 4, and a filler 601 is provided outside the seal 600. The light adjustment panels 1 vertically adjacent to each other are joined together with a translucent bonding agent 720. For example, an array substrate 2 of the second light adjustment panel 1B is joined to a counter substrate 3 of the third light adjustment panel 1C with the translucent bonding agent 720 interposed therebetween. In a case where a light source is provided at the panel unit 110, the light source is provided directly below the panel unit 110 when viewed in FIG. 1B.

The flexible printed circuits 400, 410, 420, and 430 are electrically coupled to the light adjustment panels 1, respectively. As illustrated in FIG. 1A, the flexible printed circuits 400 and 420 extend in the Y1 direction, and the flexible printed circuits 410 and 430 extend in the Y2 direction. The flexible printed circuits 400, 410, 420, and 430 are not superimposed on one another when the light adjustment device 100 is viewed from the upper side. End parts of the flexible printed circuits 400, 410, 420, and 430 are each electrically coupled to a connector 510 provided on a printed circuit 500. A harness 520 is provided on the printed circuit 500. The connector 510 is electrically coupled to the harness 520.

As illustrated in FIG. 2, each light adjustment panel 1 includes the array substrate (first substrate) 2 and the counter substrate (second substrate) 3 disposed on the upper side of the array substrate 2. Each adjust light panel 1 is a regular octagon in a plan view and has a first side 11, a second side 12, a third side 13, a fourth side 14, a fifth side 15, a sixth side 16, a seventh side 17, and an eighth side 18.

The first side 11 is positioned on the Y1 side on the light adjustment panel 1. The first side 11 extends in the X direction. The first side 11 of the light adjustment panel 1 overlaps a first side 211 of the array substrate 2 illustrated in FIG. 3. However, a first side 311 of the counter substrate 3 illustrated in FIG. 4 is positioned on the Y2 side relative to the first side 211 of the array substrate 2. Thus, as illustrated in FIG. 2, an end part 2c of the array substrate 2 on the Y1 side is exposed when the counter substrate 3 is stacked on the upper side relative to the array substrate 2. A first terminal group 10 is provided at the end part 2c.

The second side 12 is positioned on the X1 side on the light adjustment panel 1. The second side 12 extends in the Y direction. The second side 12 of the light adjustment panels 1 overlaps a second side 212 of the array substrate 2 illustrated in FIG. 3. However, a second side 312 of the counter substrate 3 illustrated in FIG. 4 is positioned on the X2 side relative to the second side 212 of the array substrate 2. Thus, as illustrated in FIG. 2, an end part 2d of the array substrate 2 on the X1 side is exposed when the counter substrate 3 is stacked on the upper side relative to the array substrate 2. A second terminal group 20 is provided at the end part 2d.

The third side 13 intersects both the X1 direction and the Y1 direction. The angle of the intersection is 45°. The third side 13 overlaps a third side 213 of the array substrate 2 illustrated in FIG. 3 and a third side 313 of the counter substrate 3 illustrated in FIG. 4.

The fourth side 14 intersects both the X1 direction and the Y2 direction. The angle of the intersection is 45°. The fourth side 14 overlaps a fourth side 214 of the array substrate 2 illustrated in FIG. 3 and a fourth side 314 of the counter substrate 3 illustrated in FIG. 4.

The fifth side 15 is positioned on the Y2 side on the light adjustment panel 1. The fifth side 15 overlaps a fifth side 215 of the array substrate 2 illustrated in FIG. 3 and a fifth side 315 of the counter substrate 3 illustrated in FIG. 4.

The sixth side 16 intersects both the X2 direction and the Y2 direction. The angle of the intersection is 45°. The sixth side 164 overlaps a sixth side 216 of the array substrate 2 illustrated in FIG. 3 and a sixth side 316 of the counter substrate 3 illustrated in FIG. 4.

The seventh side 17 is positioned on the X2 side on the light adjustment panel 1. The seventh side 17 overlaps a seventh side 217 of the array substrate 2 illustrated in FIG. 3 and a seventh side 317 of the counter substrate 3 illustrated in FIG. 4.

The eighth side 18 intersects both the X2 direction and the Y1 direction. The angle of the intersection is 45°. The eighth side 18 overlaps an eighth side 218 of the array substrate 2 illustrated in FIG. 3 and an eighth side 318 of the counter substrate 3 illustrated in FIG. 4.

Accordingly, the area of the counter substrate 3 is smaller than the area of the array substrate 2, and thus the first terminal group 10 provided at the end part 2c of the array substrate 2 and the second terminal group 20 provided at the end part 2d of the array substrate 2 are exposed. The third side 13, which couples the first side 11 and the second side 12, has a straight line shape intersecting the first side 11 and the second side 12 but may have a curved line shape such as a convex circular arc shape. This is the same for the fourth side 14, the sixth side 16, and the eighth side 18.

The following describes the array substrate 2 and the counter substrate 3 with reference to FIGS. 3 and 4. FIG. 4 is a schematic diagram illustrating a front surface 3a on which wires are provided among the front and back surfaces of the counter substrate 3. Accordingly, the X1 and X2 directions of the counter substrate 3 in FIG. 4 are opposite the X1 and X2 directions of the array substrate 2 in FIG. 3. FIG. 3 illustrates a central line CL1 extending in the Y direction through the center of the array substrate 2 in the X direction, and a central line CL2 extending in the X direction through the center of the array substrate 2 in the Y direction. As illustrated in FIG. 3, at the end part 2c along the first side 211 of the array substrate 2, the first terminal group 10 is provided at a first end part 21 (illustrated with dashed and double-dotted lines) on a side closer to the second side 212 (or the third side 213) with respect to the center of the first side 211. In other words, the end part 2c is an end part of the array substrate 2 on the Y1 side, and the first end part 21 illustrated with dashed and double-dotted lines is disposed on the X1 side of the central line CL1 among sites of the end part 2c. The first terminal group 10 is provided at the first end part 21. As illustrated in FIG. 3, the first terminal group 10 includes a first terminal 101, a second terminal 102, a third terminal 103, and a fourth terminal 104. The first terminal 101, the second terminal 102, the third terminal 103, and the fourth terminal 104 are sequentially arranged in the X direction (fourth direction) from the X1 side toward the X2 side. The terminals 101 to 104 each have a pair of short sides 105 parallel to the first side 211 and a pair of long sides 106 parallel to the second side 212.

In addition, as illustrated in FIG. 3, at the end part 2d along the second side 212 of the array substrate 2, the second terminal group 20 is provided at a second end part 22 (illustrated with dashed and double-dotted lines) on a side closer to the first side 211 (or the third side 213) with respect to the center of the second side 212. In other words, the end part 2d is an end part of the array substrate 2 on the X1 side, and the second end part 22 illustrated with dashed and double-dotted lines is disposed on the Y1 side of the central line CL2 among sites of the end part 2d. The second terminal group 20 is provided at the second end part 22. As illustrated in FIG. 3, the second terminal group 20 includes a fifth terminal 201, a sixth terminal 202, a seventh terminal 203, and an eighth terminal 204. The fifth terminal 201, the sixth terminal 202, the seventh terminal 203, and the eighth terminal 204 are sequentially arranged in the front-back direction (Y direction) from the Y1 side toward the Y2 side. The terminals 201 to 204 each have a pair of long sides 107 parallel to the first side 211 and a pair of short sides 108 parallel to the second side 212.

The following describes wires on the array substrate 2 and the counter substrate 3. Wires are provided on the front surface of each substrate among the front and back surfaces thereof. In other words, a surface on which wires are provided is referred to as the front surface, and a surface opposite to the front surface is referred to as the back surface.

As illustrated in FIG. 3, wires, liquid crystal drive electrodes, and coupling portions are provided on a front surface 2a of the array substrate 2. A coupling portion C1 of the array substrate 2 and a coupling portion C3 of the counter substrate 3 (refer to FIG. 4) are electrically coupled to each other through a conductive pillar (not illustrated) through which conduction is possible. Similarly, a coupling portion C2 of the array substrate 2 and a coupling portion C4 of the counter substrate 3 (refer to FIG. 4) are electrically coupled to each other through a common electrode (not illustrated) through which conduction is possible.

The first terminal 101 and the fifth terminal 201 are electrically coupled to each other through a wire (first wire) 241. A bifurcation point 242 is provided halfway through the wire 241, and a wire extends from the bifurcation point 242 to the coupling portion C1.

The second terminal 102 and the sixth terminal 202 are electrically coupled to each other through wires (second wires) 243 and 245. A bifurcation point 244 is provided on the wire 243, and a wire 246 extends from the bifurcation point 244 to an end 247.

The third terminal 103 and the seventh terminal 203 are electrically coupled to each other through a wire (third wire) 248. The fourth terminal 104 and the eighth terminal 204 are electrically coupled to each other through wires (fourth wires) 249 and 251. The wire 249 extends up to a bifurcation point 250 from the fourth terminal 104 toward the X2 side. The wire 251 extends from the bifurcation point 250 to the eighth terminal 204. A wire extends from the bifurcation point 250 to the coupling portion C2.

A plurality of liquid crystal drive electrodes 261 are coupled to the wires 243 and 246. The liquid crystal drive electrodes 261 extend straight in the X direction. The liquid crystal drive electrodes 261 are disposed at equal intervals in the Y direction.

A plurality of liquid crystal drive electrodes 262 are coupled to the wire 248. The liquid crystal drive electrodes 262 extend straight in the X direction. The liquid crystal drive electrodes 262 are disposed at equal intervals in the Y direction. The liquid crystal drive electrodes 261 and 262 are alternately arranged in the Y direction.

As illustrated in FIG. 4, wires, liquid crystal drive electrodes, and coupling portions are provided on the front surface 3a of the counter substrate 3. The central lines CL1 and CL2 illustrated in FIG. 4 correspond to the central lines CL1 and CL2 illustrated in FIG. 3.

The coupling portion C3 is coupled to wires 342 and 343 through a bifurcation point 341. The wire 342 extends to an end 348. The wire 343 extends to an end 349. The coupling portion C4 is coupled to wires 345 and 346 through a bifurcation point 344. The wire 346 extends to an end 347.

A plurality of liquid crystal drive electrodes 361 are coupled to the wires 342 and 343. The liquid crystal drive electrodes 361 extend straight in the Y direction. The liquid crystal drive electrodes 361 are disposed at equal intervals in the X direction.

A plurality of liquid crystal drive electrodes 362 are coupled to the wire 346. The liquid crystal drive electrodes 362 extend straight in the Y direction. The liquid crystal drive electrodes 362 are disposed at equal intervals in the X direction. The liquid crystal drive electrodes 361 and 362 are alternately arranged in the X direction.

Figure 5:
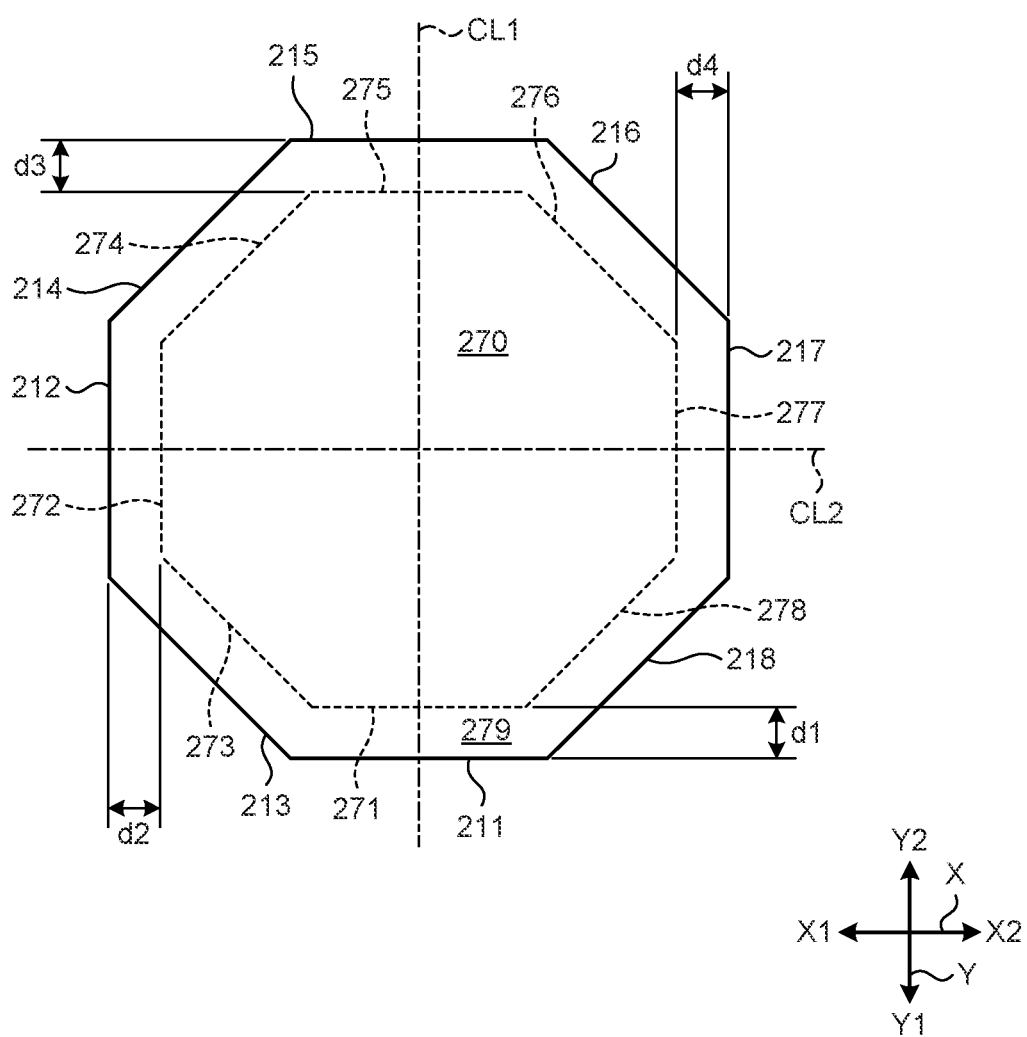
FIG. 5 is a schematic diagram illustrating an effective region of the array substrate according to the embodiment.
Figure 6:
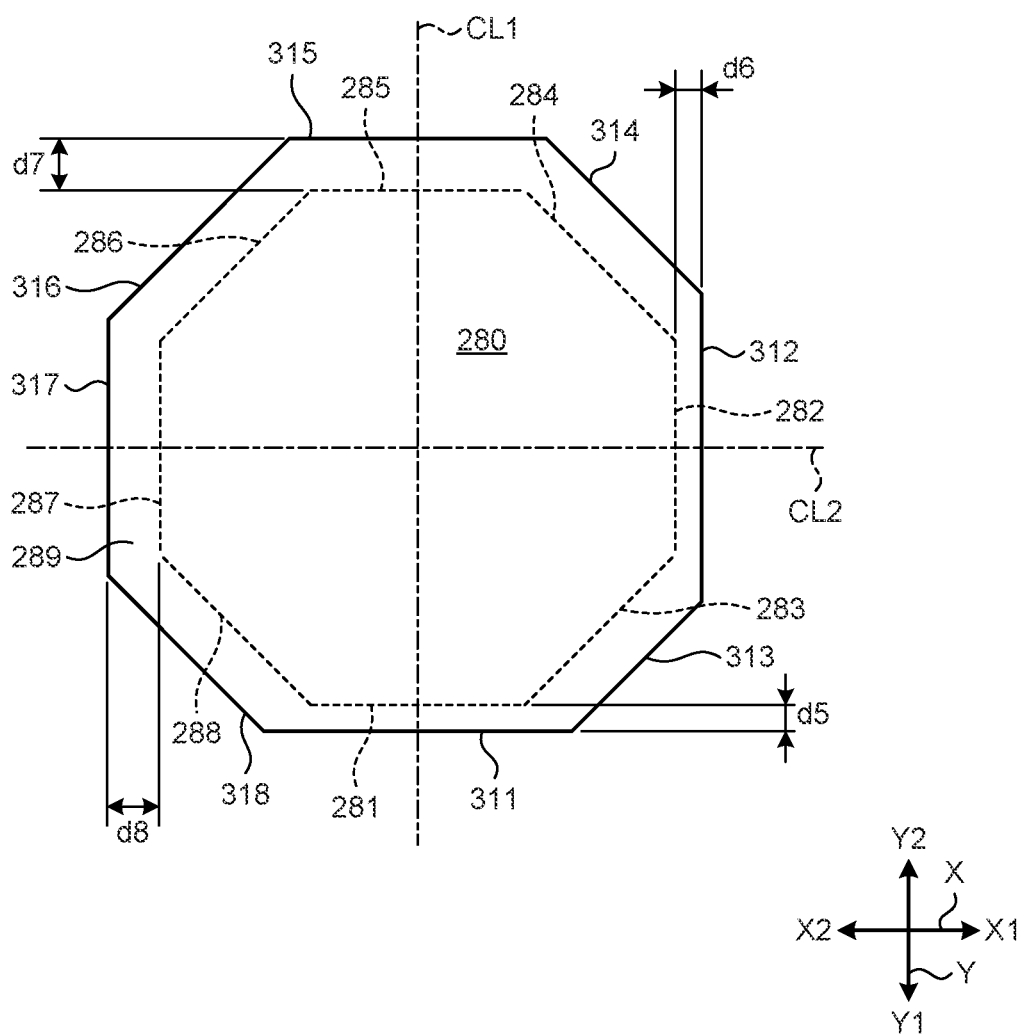
FIG. 6 is a schematic diagram illustrating an effective region of the counter substrate according to the embodiment when turned over, illustrating its front surface as in FIG. 4.

The following describes the effective regions of the array substrate and the counter substrate. FIG. 5 is a schematic diagram illustrating the effective region of the array substrate according to the embodiment. FIG. 6 is a schematic diagram illustrating the effective region of the counter substrate according to the embodiment when turned over, illustrating the front surface 3a of the counter substrate 3 as in FIG. 4. Accordingly, the X1 and X2 directions of the counter substrate 3 in FIG. 6 are opposite the X1 and X2 directions of the array substrate 2 in FIG. 5.

As illustrated in FIG. 5, the effective region 270 illustrated with dashed lines is disposed at a central part of the array substrate 2. The effective region 270 is a regular octagon. Specifically, the effective region 270 has a first side 271, a second side 272, a third side 273, a fourth side 274, a fifth side 275, a sixth side 276, a seventh side 277, and an eighth side 278.

The first side 271 of the effective region 270 is disposed on the Y2 side relative to the first side 211 of the array substrate 2 and is parallel to the first side 211. The first side 211 and the first side 271 are separated from each other by a distance d1.

The second side 272 of the effective region 270 is disposed on the X2 side relative to the second side 212 of the array substrate 2 and is parallel to the second side 212. The second side 212 and the second side 272 are separated from each other by a distance d2. The third side 273 of the effective region 270 is disposed on the X2 side and the Y2 side relative to the third side 213 of the array substrate 2 and is parallel to the third side 213. The fourth side 274 of the effective region 270 is disposed on the X2 side and the Y1 side relative to the fourth side 214 of the array substrate 2 and is parallel to the fourth side 214. The fifth side 275 of the effective region 270 is disposed on the Y1 side relative to the fifth side 215 of the array substrate 2 and is parallel to the fifth side 215. The fifth side 215 and the fifth side 275 are separated from each other by a distance d3. The sixth side 276 of the effective region 270 is disposed on the X1 side and the Y1 side relative to the sixth side 216 of the array substrate 2 and is parallel to the sixth side 216. The seventh side 277 of the effective region 270 is disposed on the X1 side relative to the seventh side 217 of the array substrate 2 and is parallel to the seventh side 217. The seventh side 217 and the seventh side 277 are separated from each other by a distance d4. The eighth side 278 of the effective region 270 is disposed on the X1 side and the Y2 side relative to the eighth side 218 of the array substrate 2 and is parallel to the eighth side 218. As illustrated in FIG. 5, the outside of the effective region 270 is an ineffective region 279. The distances d1, d2, d3, and d4 are equal to one another.

As illustrated in FIG. 6, the effective region 280 illustrated with dashed lines is disposed at a central part of the counter substrate 3. The effective region 280 is a regular octagon. Specifically, the effective region 280 includes a first side 281, a second side 282, a third side 283, a fourth side 284, a fifth side 285, a sixth side 286, a seventh side 287, and an eighth side 288.

The first side 281 of the effective region 280 is disposed on the Y2 side relative to the first side 311 of the counter substrate 3 and is parallel to the first side 311. The first side 311 and the first side 281 are separated from each other by a distance d5. The second side 282 of the effective region 280 is disposed on the X2 side relative to the second side 312 of the counter substrate 3 and is parallel to the second side 312. The second side 312 and the second side 282 are separated from each other by a distance d6. The third side 283 of the effective region 280 is disposed on the X2 side and the Y2 side relative to the third side 313 of the counter substrate 3 and is parallel to the third side 313. The fourth side 284 of the effective region 280 is disposed on the X2 side and the Y1 side relative to the fourth side 314 of the counter substrate 3 and is parallel to the fourth side 314. The fifth side 285 of the effective region 280 is disposed on the Y1 side relative to the fifth side 315 of the counter substrate 3 and is parallel to the fifth side 315. The fifth side 315 and the fifth side 285 are separated from each other by a distance d7. The sixth side 286 of the effective region 280 is disposed on the X1 side and the Y1 side relative to the sixth side 316 of the counter substrate 3 and is parallel to the sixth side 316. The seventh side 287 of the effective region 280 is disposed on the X1 side relative to the seventh side 317 of the counter substrate 3 and is parallel to the seventh side 317. The seventh side 317 and the seventh side 287 are separated from each other by a distance d8. The eighth side 288 of the effective region 280 is disposed on the X1 side and the Y2 side relative to the eighth side 318 of the counter substrate 3 and is parallel to the eighth side 318. As illustrated in FIG. 6, the outside of the effective region 280 is an ineffective region 289. The distances d5 and d6 are equal to each other, and the distances d7 and d8 are equal to each other. The distances d5 and d6 are shorter than the distances d7 and d8. The distances d7 and d8 are equal to the distances d1, d2, d3, and d4.

The effective region 270 of the array substrate 2 and the effective region 280 of the counter substrate 3 have the same shape and the same size. In other words, the effective regions 270 and 280 are congruent with each other. Accordingly, the effective regions 270 and 280 match each other in a plan view when the array substrate 2 and the counter substrate 3 are stacked with their outer peripheries aligned.

The following briefly describes a sectional structure of each light adjustment panel 1. FIG. 7 is a sectional view taken along line VII-VII in FIG. 3. As illustrated in FIG. 7, each light adjustment panel 1 includes the array substrate (first substrate) 2, the counter substrate (second substrate) 3, and the liquid crystal layer 4. As illustrated in FIG. 7, the counter substrate 3 is disposed on the upper side (Z1 side) of the array substrate 2. The liquid crystal layer 4 is provided between the counter substrate 3 and the array substrate 2. Specifically, the front surface 2a of the array substrate 2 and the front surface 3a of the counter substrate 3 face each other with the liquid crystal layer 4 interposed therebetween. The array substrate 2 has a back surface 2b opposite the front surface 2a, and the counter substrate 3 has a back surface 3b opposite the front surface 3a. Since the area of the counter substrate 3 is smaller than the area of the array substrate 2 as described above, the third terminal 103 provided on the front surface 2a of the array substrate 2 is exposed. An insulating layer, which is provided to prevent contact between two wires, is not provided in the light adjustment panel 1 according to the present embodiment because no wires on the array substrate (first substrate) 2 overlap each other.

In addition, alignment films 610 are stacked on both substrates and the electrodes as illustrated in FIG. 7. Specifically, one of the alignment films 610 is stacked on the front surface 2a of the array substrate 2 and the upper surfaces of the liquid crystal drive electrodes 261 and 262, and part of the third wire 248. The other alignment film 610 is stacked on the front surface 3a of the counter substrate 3 and the upper surfaces of the liquid crystal drive electrodes 361. The array substrate 2 and the counter substrate 3 are bonded to each other by the seal 600 enclosing the effective regions, and the liquid crystal layer 4 fills a space formed by the seal 600.

Figure 8:
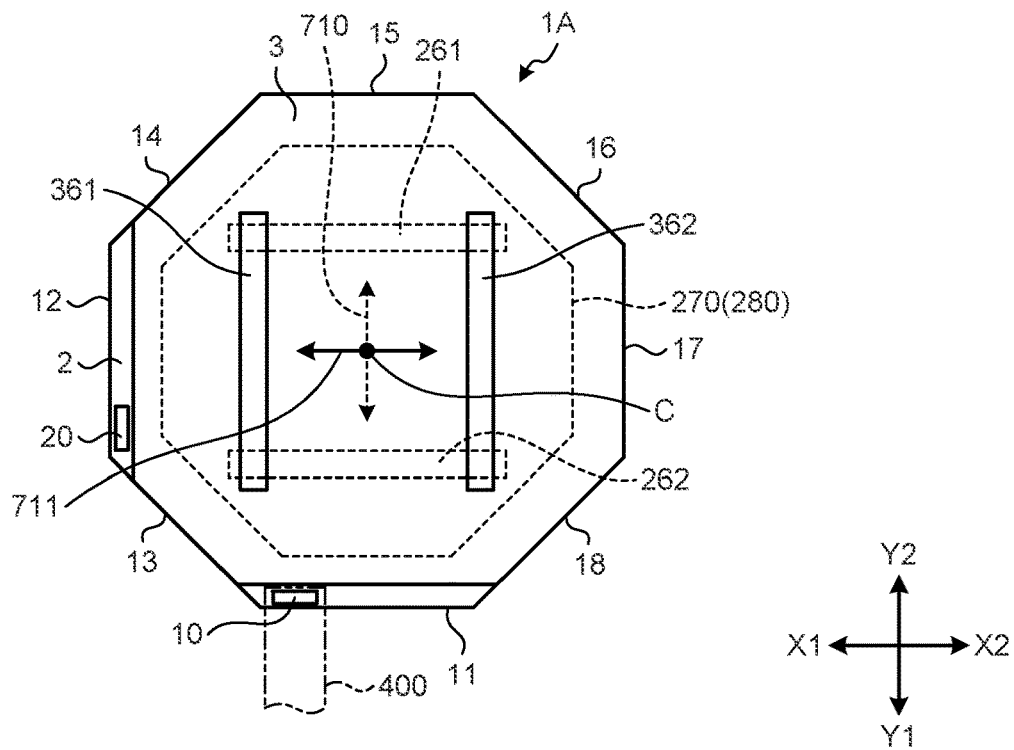
FIG. 8 is a schematic diagram of a first light adjustment panel included in the light adjustment device in FIG. 1A when viewed from the upper side.
Figure 9:
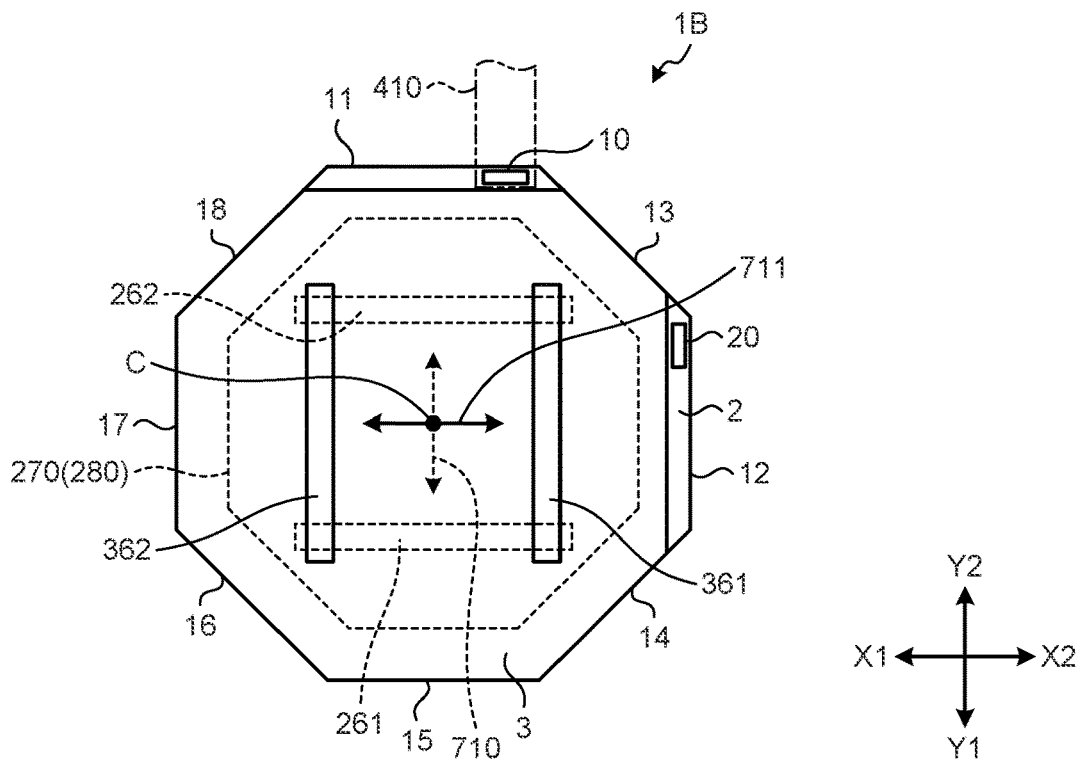
FIG. 9 is a schematic diagram of a second light adjustment panel included in the light adjustment device in FIG. 1A when viewed from the upper side.

The following describes the four light adjustment panels 1A, 1B, 1C, and 1D included in the panel unit 110 illustrated in FIG. 1A. FIG. 8 is a schematic diagram of the first light adjustment panel included in the light adjustment device in FIG. 1A when viewed from the upper side. FIG. 9 is a schematic diagram of the second light adjustment panel included in the light adjustment device in FIG. 1A when viewed from the upper side. FIG. 10 is a schematic diagram of the third light adjustment panel included in the light adjustment device in FIG. 1A when viewed from the upper side. FIG. 11 is a schematic diagram of the fourth light adjustment panel included in the light adjustment device in FIG. 1A when viewed from the upper side. The stacking order of the four light adjustment panels 1A, 1B, 1C, and 1D is not particularly limited but may be any order although the present embodiment describes a case where the first light adjustment panel 1A is disposed lowermost, the second light adjustment panel 1B is stacked on the upper side of the first light adjustment panel 1A, the third light adjustment panel 1C is stacked on the upper side of the second light adjustment panel 1B, and the fourth light adjustment panel 1D is disposed uppermost. In FIGS. 8 to 11, a center C is illustrated at the center of each of the light adjustment panels 1A, 1B, 1C, and 1D.

As illustrated in FIG. 8, in the first light adjustment panel 1A disposed lowermost, the first terminal group 10 is positioned on the Y1 side and the second terminal group 20 is positioned on the X1 side. The flexible printed circuit 400 is electrically coupled to the first terminal group 10 and extends toward the Y1 side. The second terminal group 20 on which no circuit is mounted is sealed with a moisture-proof material such as silicone. The effective region 270 (280) is illustrated with a regular octagon in FIGS. 8 to 11. In the first light adjustment panel 1A, an alignment direction 710 of the alignment film 610 on the array substrate 2 is, for example, the Y direction, and an alignment direction 711 of the alignment film 610 on the counter substrate 3 is a direction orthogonal to the alignment direction 710 of the array substrate 2.

As illustrated in FIG. 9, in the second light adjustment panel 1B disposed second lowermost, the first terminal group 10 is positioned on the Y2 side and the second terminal group 20 is positioned on the X2 side. Specifically, the second light adjustment panel 1B is the same as the first light adjustment panel 1A rotated by 180° in a plan view. The flexible printed circuit 410 is electrically coupled to the first terminal group 10 and extends toward the Y2 side. The second terminal group 20 on which no circuit is mounted is sealed with a moisture-proof material such as silicone. In the second light adjustment panel 1B, the alignment direction 710 of the alignment film 610 on the array substrate 2 is, for example, the Y direction, and the alignment direction 711 of the alignment film 610 on the counter substrate 3 is the direction orthogonal to the alignment direction 710 of the array substrate 2.

As illustrated in FIG. 10, in the third light adjustment panel 1C disposed second uppermost, the second terminal group 20 is positioned on the Y1 side and the first terminal group 10 is positioned on the X2 side. Specifically, the third light adjustment panel 1C is the same as the first light adjustment panel 1A rotated by 90° in the anticlockwise direction in a plan view. The flexible printed circuit 420 is electrically coupled to the second terminal group 20 and extends toward the Y1 side. The first terminal group 10 on which no circuit is mounted is sealed with a moisture-proof material such as silicone. In the third light adjustment panel 1C, the alignment direction 710 of the alignment film 610 on the array substrate 2 is, for example, the X direction, and the alignment direction 711 of the alignment film 610 on the counter substrate 3 is the direction orthogonal to the alignment direction 710 of the array substrate 2.

As illustrated in FIG. 11, in the fourth light adjustment panel 1D disposed uppermost, the second terminal group 20 is positioned on the Y2 side and the first terminal group 10 is positioned on the X1 side. Specifically, the fourth light adjustment panel 1D is the same as the light adjustment panel 1A rotated by 270° in the anticlockwise direction in a plan view. The flexible printed circuit 430 is electrically coupled to the second terminal group 20 and extends toward the Y2 side. The first terminal group 10 on which no circuit is mounted is sealed with a moisture-proof material such as silicone. In the fourth light adjustment panel 1D, the alignment direction 710 of the alignment film 610 on the array substrate 2 is, for example, the X direction, and the alignment direction 711 of the alignment film 610 on the counter substrate 3 is the direction orthogonal to the alignment direction 710 of the array substrate 2.

As described above, the light adjustment device 100 includes: the panel unit 110 in which a plurality of light adjustment panels 1 are stacked in the Z direction (first direction), each light adjustment panel 1 including the array substrate (first substrate) 2 and the counter substrate (second substrate) 3, the array substrate (first substrate) 2 including two or more of the first terminal group 10 and the second terminal group 20 (terminal groups) each including a plurality of terminals that can be coupled to one flexible printed circuit 400, 410, 420, or 430, the counter substrate (second substrate) 3 overlapping the array substrate 2; and the flexible printed circuits 400, 410, 420, and 430 each coupled to one of the terminal groups of one of the light adjustment panels 1. When the panel unit 110 is viewed in the Z direction, a plurality of the terminal groups coupled to the flexible printed circuits 400, 410, 420, and 430 are provided at each of an end part of the light adjustment panel 1 in the Y1 direction (second direction) intersecting the Z direction and an end part of the light adjustment panel 1 in the Y2 direction (third direction) opposite the Y1 direction, the plurality of flexible printed circuits 400, 410, 420, and 430 are not superimposed on each other. More specifically, the flexible printed circuit 400 of the light adjustment panel 1A and the flexible printed circuit 420 of the light adjustment panel 1C both extend in the Y1 direction. The first terminal group 10 of the light adjustment panel 1A, which faces the flexible printed circuit 400, and the second terminal group 20 of the light adjustment panel 1C, which faces the flexible printed circuit 420, are arranged alongside each other in the X direction in a plan view, and accordingly, the flexible printed circuits 400 and 420 are not superimposed on each other in a plan view. Similarly, the flexible printed circuit 410 of the light adjustment panel 1B and the flexible printed circuit 430 of the light adjustment panel 1D both extend in the Y2 direction and the first terminal group 10 of the light adjustment panel 1B, which faces the flexible printed circuit 410, and the second terminal group 20 of the light adjustment panel 1D, which faces the flexible printed circuit 430, are arranged alongside each other in the X direction in a plan view, and accordingly, the flexible printed circuits 410 and 430 are not superimposed on each other in a plan view.

As described above, the number of printed circuits increases and the size of the light adjustment device potentially increases when flexible printed circuits are extended in a plurality of directions from each light adjustment panel in a plan view in a case where the printed circuits are coupled to each of a plurality of stacked light adjustment panels via the flexible printed circuits. Thus, in the present embodiment, the flexible printed circuits 400, 410, 420, and 430 are extended from sides in the Y1 direction (second direction) and the Y2 direction (third direction) on each light adjustment panel 1 in a plan view. Accordingly, the number of printed circuits 500 can be reduced in a case where the printed circuits 500 are coupled in a non-superimposed state to each of a plurality of stacked light adjustment panels 1 via the flexible printed circuits 400, 410, 420, and 430.

It can be considered that flexible printed circuits are extended for one printed circuit in one direction from each light adjustment panel in a plan view; however, this case is disadvantageous in that the number of flexible printed circuits that can be extended in a non-superimposed state decreases. Specifically, for example, only the two flexible printed circuits 400 and 420 can be extended in a case where a plurality of flexible printed circuits are extended in a non-superimposed state only in the Y1 direction as illustrated in FIG. 1A. However, the four flexible printed circuits 400, 410, 420, and 430 can be extended in the two Y1 and Y2 directions as in the present embodiment.

In the first terminal group 10 and the second terminal group 20 (terminal groups) provided on the array substrate (first substrate) 2, the first terminal 101, the second terminal 102, the third terminal 103, and the fourth terminal 104 (terminals) included in the first terminal group 10 are electrically coupled to the fifth terminal 201, the sixth terminal 202, the seventh terminal 203, and the eighth terminal 204 (terminals) included in the second terminal group 20.

Thus, the flexible printed circuits 400, 410, 420, and 430 can be coupled to any of the first terminal group 10 and the second terminal group 20. Accordingly, for example, in the panel unit 110 in which the four light adjustment panels 1A, 1B, 1C, and 1D are vertically stacked, the flexible printed circuits 400 and 420 extended in the Y1 direction are not superimposed on the flexible printed circuits 410 and 430 extended in the Y2 direction as illustrated in FIG. 1A by changing the orientations of the light adjustment panels 1A, 1B, 1C, and 1D.

In each of the light adjustment panels 1, the first terminal group 10 and the second terminal group 20 coupled to the flexible printed circuits 400, 410, 420, and 430 are arranged in the X direction (fourth direction) intersecting the Z direction and the Y1 direction when the panel unit 110 is viewed in the Z direction. With this configuration, when a plurality of light adjustment panels 1 are stacked, the first terminal groups 10 or the second terminal groups 20 coupled to the flexible printed circuits 400, 410, 420, and 430 are disposed in a non-superimposed state on the Y1 side or the Y2 side in a plan view.

The array substrate 2 is shaped in an octagon that has the first side 211 and the second side 212 intersecting the first side 211 (in a polygon the number of sides of which is four or more). The terminal groups are provided at the first end part 21 provided at an end part along the first side 211 of the array substrate 2 and closer to the second side 212 with respect to the center of the first side 211, and the second end part 22 provided at an end part along the second side 212 and closer to the first side 211 with respect to the center of the second side 212. The first terminal group 10 is provided at the first end part 21, and the second terminal group 20 is provided at the second end part 22.

With this configuration, the first terminal groups 10 or the second terminal groups 20 coupled to the flexible printed circuits 400, 410, 420, and 430 are disposed in a non-superimposed state on the Y1 side or the Y2 side through simple work of rotating the light adjustment panels 1A, 1B, 1C, and 1D having the same structure. Specifically, the light adjustment panels 1A, 1B, 1C, and 1D each have a rotation center at the center C (refer to FIGS. 8 to 11), and the first terminal groups 10 or the second terminal groups 20 coupled to the flexible printed circuits 400, 410, 420, and 430 are disposed in a non-superimposed state on the Y1 side or the Y2 side through simple work of clockwise or anticlockwise rotation about the center C.

The wire (first wire) 241 and the wires (fourth wires) 249 and 251 on the array substrate 2 are electrically coupled to wires on the counter substrate 3 stacked on the array substrate 2 through a conductive pillar. Thus, conduction between the wires on the array substrate (first substrate) 2 and the wires on the counter substrate (second substrate) 3 is provided with a simple structure.

What is claimed is:

1. A light adjustment panel including a first substrate and a second substrate, the first substrate including a first terminal group and a second terminal group each including a plurality of terminals couplable to one flexible printed circuit, the second substrate overlapping the first substrate, wherein
   the first substrate has a first side and a second side intersecting the first side,
   the first terminal group is provided along the first side and the second terminal group is provided along the second side, and
   when the panel is viewed in the first direction, the terminal groups are provided at:
      a first end part provided at an end part along the first side of the first substrate and closer to the second side with respect to a center of the first side; and
      a second end part provided at an end part along the second side and closer to the first side with respect to a center of the second side.

2. The light adjustment panel according to claim 1, wherein
   the first substrate has a third side coupling the first side and the second side,
   the first terminal group is provided at a position in proximity to the third side, and
   the second terminal group is provided at a position in proximity to the third side.

3. The light adjustment panel according to claim 1, wherein
   each terminal of the first terminal group has a short side parallel to the first side and a long side parallel to the second side, and
   each terminal of the second terminal group has a long side parallel to the first side and a short side parallel to the second side.

* * * * *